United States Patent [19]
Yamaguchi et al.

[11] Patent Number: 5,777,365
[45] Date of Patent: Jul. 7, 1998

[54] SEMICONDUCTOR DEVICE HAVING A SILICON-ON-INSULATOR STRUCTURE

[75] Inventors: Hitoshi Yamaguchi, Nagoya; Toshiyuki Morishita, Iwakura; Hiroaki Himi, Nagoya, all of Japan

[73] Assignee: Nippondenso Co., Ltd., Kariya, Japan

[21] Appl. No.: 721,626

[22] Filed: Sep. 26, 1996

[30] Foreign Application Priority Data

Sep. 28, 1995 [JP] Japan .................................. 7-251612

[51] Int. Cl.$^6$ .................................................. H01L 27/02
[52] U.S. Cl. ......................... 257/347; 257/506; 257/507; 257/720
[58] Field of Search ............................... 257/347, 506, 257/507, 508, 524, 499, 720

[56] References Cited

U.S. PATENT DOCUMENTS

| | | | |
|---|---|---|---|
| 5,049,968 | 9/1991 | Nakagawa et al. | 257/510 |
| 5,072,287 | 12/1991 | Nakagawa et al. | 257/506 |
| 5,442,223 | 8/1995 | Fujii | 257/506 |
| 5,525,824 | 6/1996 | Himi et al. | 257/370 |
| 5,536,961 | 7/1996 | Nakagawa et al. | 257/506 |
| 5,650,354 | 7/1997 | Himi et al. | 437/63 |

FOREIGN PATENT DOCUMENTS

| | | |
|---|---|---|
| 1-103851 | 4/1989 | Japan . |
| 1-251635 | 10/1989 | Japan . |
| 6-87480 | 11/1994 | Japan . |
| 7-135248 | 5/1995 | Japan . |

OTHER PUBLICATIONS

The Effect of Temperature on Lateral DMOS Transistors in a Power IC Technology. IEEE Trans. On Electron Devices, vol. 4, Apr. 1992, pp. 990–1005.

"Measurement and Modeling of Self-Heating in SOI NMOSFET'S," IEEE Trans. On Electron Devices, vol. 41, No. 1, Jan. 1994, pp. 69–75.

*Primary Examiner*—Tom Thomas
*Assistant Examiner*—David B. Hardy
*Attorney, Agent, or Firm*—Cushman Darby & Cushman IP Group of Pillsbury Madison & Sutro LLP

[57] ABSTRACT

A semiconductor device of SOI structure exhibits a excellent heat-radiating characteristic while assuring breakdown-voltage and element-isolating performance. A buried silicon oxide film having a thickness required by the breakdown-voltage of a semiconductor element is buried between a SOI layer and a silicon substrate. A SOI layer is divided into island silicon regions by a groove for electrical-isolation use, and the groove is filled with dielectric such as an oxide film and polycrystalline silicon. In an island silicon region, a LDMOS transistor having high breakdown voltage may be formed as the semiconductor element, and potential distribution is created in accordance with a voltage application to the semiconductor element. The buried silicon oxide film at a region where low electric potential is distributed, for example a region below a grounded well region of the LDMOS transistor, is made thin. Through the thin portion of the buried silicon oxide film, heat generated by the operation of the semiconductor element can easily be propagated to the silicon substrate and radiated.

19 Claims, 6 Drawing Sheets

SEMICONDUCTOR DEVICE HAVING A SILICON-ON-INSULATOR STRUCTURE

CROSS REFERENCE TO RELATED APPLICATION

This application is based upon and claims the benefit of priority of the prior Japanese Patent Application No. 7-251612 filed on Sep. 28, 1995, the contents of which are incorporated herein by reference.

BACKGROUND OF THE INVENTION

1. Field of the Invention:

The present invention relates to a semiconductor device having a silicon-on-insulator (SOI) structure, and is favorable for application in an IC for a driving use having high voltage and a plurality of output stages utilized in for example a flat-panel display, particularly an electro luminescence (EL) display, plasma display, or the like.

2. Related Arts:

For example, Japanese Patent Application Laid-open No. 1-103851 is known as prior art relating to a high breakdown voltage semiconductor element utilized in dielectric isolation. As shown in FIG. 16, a silicon layer 42 is formed via a dielectric film 41 on a silicon substrate 40. And along with this, the silicon layer 42 forms an island region surrounded by a dielectric film 43. A lateral double-diffused MOS (LDMOS) transistor 44 is formed within this island region. The dielectric film 41 causes electrical isolation between several transistors or supporting high voltage applied between the transistor drain and the substrate in high-voltage usage. Consequently, this dielectric film 41 is formed to a considerable thickness uniformly over the entire perimeter of the transistor so as to obtain a high breakdown voltage (i.e., high dielectric strength).

However, when high voltage has been applied to this LDMOS transistor 44 and heavy current has been output, heat is generated by a resistance loss of this transistor. Heat generated at this time attempts to flow via the silicon substrate 40 to a heat sink (heat-radiating member) 45 composed of cooper plate or the like, but the above-described dielectric film 41 exists between the LDMOS transistor 44 and the silicon substrate 40. Accordingly, in a case of, for example, a silicon oxide film ($SiO_2$), a thermal-conductivity rate of this dielectric film 41 is only about 1/100 that of silicon. Thus the island region in which the LDMOS transistor 44 exists is susceptible to a buildup of heat. As a result a temperature of the region in which the LDMOS transistor is formed rises, and the output current drops due to a decline in a carrier-mobility of electrons and positive holes. Additionally, depending on the case, thermal destruction may be caused as a result of the temperature increase.

Countermeasures such as increasing the heat-radiating efficiency of the heat sink 45 have been performed, but such countermeasures were also limited.

SUMMARY OF THE INVENTION

It is an object of the present invention to provide a semiconductor device of SOI structure having an excellent heat-radiating characteristic while assuring breakdown-voltage and element-isolating performance.

The present inventors investigated potential distribution in the above-described LDMOS transistor 44. Results of this are indicated by the dotted line in FIG. 16. Namely, an equipotential line is indicated when a source electrode has been caused to be ground level (0 V) and 200 V has been applied to a drain electrode. It was understood from examination of this equipotential line that a location at which establishment of a 200-V specification is required as a breakdown voltage at this dielectric film 41 is a region centered on a lower portion of the drain region, and 200-V breakdown voltage was not required for the entire region.

In this regard, a SOI semiconductor device according to the present invention has a substrate, an insulation film disposed on the substrate, and a semiconductor layer disposed on the insulation film and is provided with a semiconductor element. The device is characterized in that it causes a region of the insulation film no requiring a high withstanding voltage to be thin. Heat generated while driving the semiconductor element is propagated downwardly, passing through the insulation film, and is propagated to the substrate side. Since a portion of the insulation film is thin, heat is radiated from this region and the temperature increase of the semiconductor element is suppressed. Additionally, because only a low potential is distributed in the semiconductor element at the region having a thin insulation film, a required withstanding voltage, or dielectric strength, is assured. Furthermore, because the semiconductor element is isolated by the insulation film, electrical isolation is also assured.

In this way, heat radiation from the semiconductor element to the substrate can be improved without impairing electrical isolation and breakdown voltage of the semiconductor element.

Further, instead of having a region with a thin insulation film where a high withstanding voltage may not be required, it is acceptable to eliminate the insulation film of this region, cause a conductivity type of the semiconductor substrate and a conductivity type of the island semiconductor region to differ from each other, and perform electrical isolation by means of a pn-junction. Accordingly, heat generated while driving the semiconductor element passes through the region having no insulation film and is propagated to the substrate side. Heat radiation occurs and a temperature increase of the element is suppressed. Additionally, because the region having no insulation film corresponds to a location at which only a low potential is distributed in the semiconductor element, breakdown voltage for the semiconductor element is assured. Furthermore, because the element is isolated by the insulation film and pn-junction, electrical isolation is also assured.

In this way, heat radiation from the semiconductor element to the substrate can be improved without impairing electrical isolation and breakdown voltage of the semiconductor element.

BRIEF DESCRIPTION OF THE DRAWINGS

These and other objects, features and characteristics of the present invention will be appreciated from a study of the following detailed description, the appended claims, and drawings, all of which form part of this application. In the drawings:

DETAILED DESCRIPTION OF THE PRESENTLY PREFERRED EXEMPLARY EMBODIMENTS

A first embodiment of the present invention will be described hereinafter with reference to the drawings.

Figure 1:
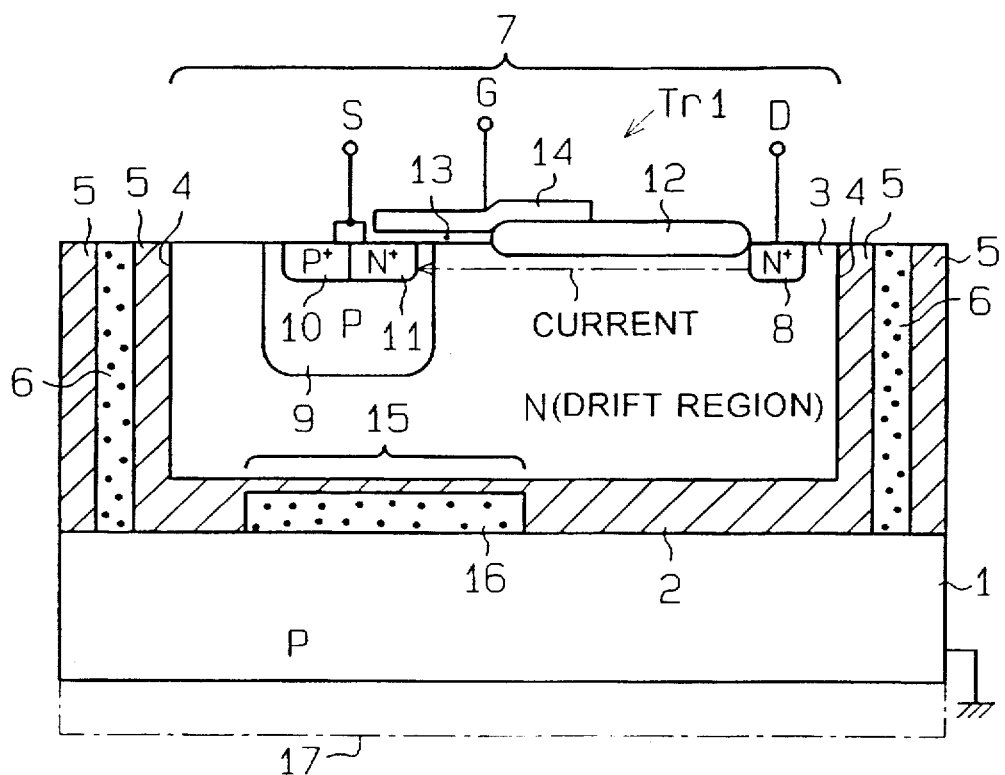
FIG. 1 is a sectional view of a semiconductor device according to a first embodiment.

FIG. 1 indicates a structure of an n-channel type LDMOS transistor having high breakdown voltage formed on a SOI substrate.

A buried silicon oxide film 2 having a thickness of 2.0 μm is formed on a p-type silicon substrate 1 as a semiconductor substrate. An n-type silicon layer 3 having a thickness of 10 μm is formed on the buried silicon oxide film 2. A groove 4 is formed in an annular configuration on the n-type silicon layer 3. a silicon oxide film 5 (thickness 1.0 μm) is formed within the groove 4, and along with this, an interior thereof is filled with polycrystalline silicon 6. In this way, an island silicon region (SOI region) 7 surrounded by the buried silicon oxide film 2 and the silicon oxide film 5 is formed on the p-type silicon substrate 1. A multiplicity of similar island silicon regions (SOI regions) 7 are formed on the silicon substrate 1, and each island silicon region 7 is mutually isolated by the above-described oxide films 2 and 5.

An n-channel type LDMOS transistor Tr1 having high breakdown voltage is formed in the island silicon region 7. That is to say, an n⁺ drain region 8 is formed in a predetermined region in a surface-layer portion of the n-type silicon layer 3, and along with this, a p well region 9 is formed in a region apart from the n⁺ drain region 8. A p⁺ source region 10 and n⁺ source region 11 are formed within the p well region 9. Further, a LOCOS oxide film (silicon oxide film formed by local oxidation of silicon) 12 is formed on an upper surface of the n-type silicon layer 3 between the n⁺ drain region 8 and p well region 9. A gate oxide film 13 is disposed on the surface of the p well region 9 and on the surface of the n-type silicon layer 3 between the LOCOS oxide film 12 and n⁺ source region 11, and a polysilicon gate electrode 14 is formed on the gate oxide film 13. The polysilicon gate electrode 14 extends to the top surface of the LOCOS oxide film 12 and above the n⁺ source region 11.

Meanwhile, the buried silicon oxide film 2 below the p well region 9 assumes a thickness of 0.1 μm , which is thinner than the thickness of 2.0 μm of other regions. Hereinafter, this region will be termed the "thin region 15." Polycrystalline silicon 16 is disposed in a lower portion of the thin region 15, and thereby an interval between the p-type silicon substrate 1 and the island silicon region 7 is caused to be uniform.

Additionally, a heat sink 17 made up of a copper plate is bonded to a lower surface of the p-type silicon substrate 1.

A source electrode S of the n-channel type LDMOS transistor Tr1 is ground level (0 V), and +50 to 300 V is applied to the drain electrode D. Additionally, the p-type silicon substrate 1 is grounded and goes to ground level (0 V).

Figure 2:
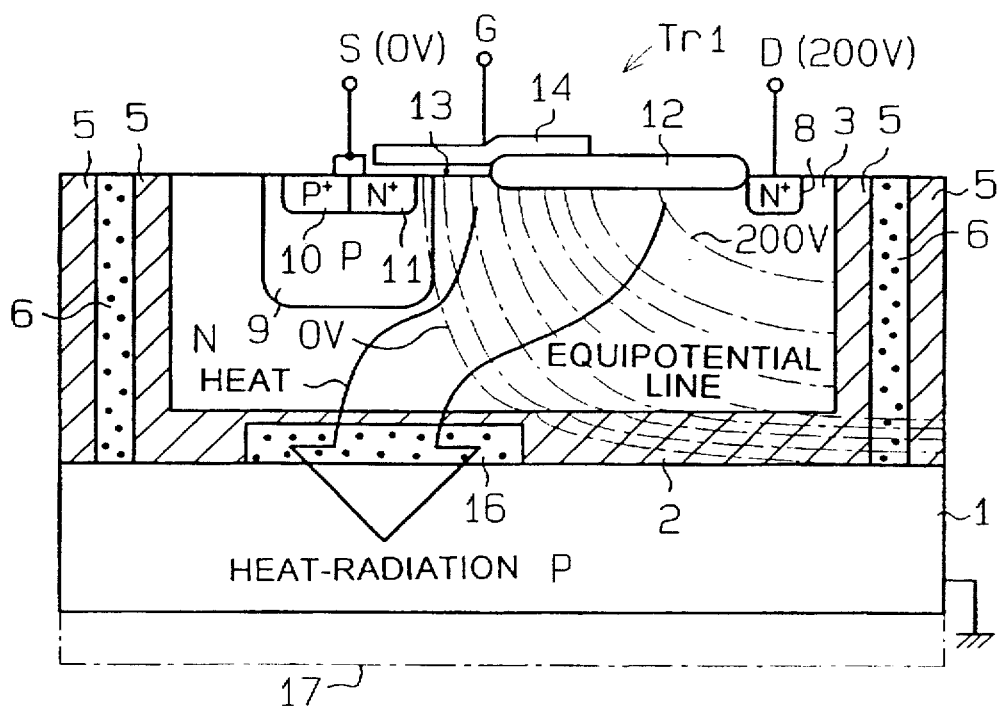
FIG. 2 is a sectional view of the semiconductor device according to the first embodiment.

FIG. 2 indicates potential distribution (equipotential line) created in the LDMOS transistor Tr1 at a time when the source electrode S is caused to be ground level (0 V) and 200 V is applied to the drain electrode D. It is understood from examination of this equipotential line that high voltage is applied to the buried silicon oxide film 2 below the n⁺ drain region 8 and to the buried silicon oxide film 2 below the LOCOS oxide film 12, and that substantially no voltage is applied to other regions. Accordingly, the buried silicon oxide film 2 below the n⁺ drain region 8 and the buried silicon oxide film 2 below the LOCOS oxide film 12 are sufficiently thick films and support high voltage. Additionally, the buried silicon oxide film 2 (thin region 15) below the p well region 9, to which substantially no voltage is applied, is thin, but there is no problem in terms of dielectric strength. Moreover heat conduction is facilitated. Additionally, polycrystalline silicon has a thermal conductivity rate which is at about the same level as single crystalline silicon, and the polycrystalline silicon 16 can easily conduct heat.

Accordingly, when voltage is applied to the gate electrode G, current flows under the silicon oxide films 12 and 13 and from the drain electrode D toward the source electrode S, as shown by the dotted line in FIG. 1. Heat is generated in the current path accompanying this passage of current. As shown in FIG. 2, this heat is downwardly oriented, passes through the thin region 15 and polycrystalline silicon 16 in the buried silicon oxide film 2, reaches the p-type silicon substrate 1, and further is radiated to the atmosphere from the heat sink 17. As a result of this, the temperature increase of the transistor formation region is suppressed, and output current can be maintained at a high level with no decline in the carrier-mobility of electrons and positive holes. Additionally, an amount of resistance to thermal destruction also can be improved.

In this way, according to the present embodiment, the region 15 where high breakdown voltage (high dielectric strength) may not be required in the buried silicon oxide film 2 is thin, and so heat is radiated from this location and the temperature increase of the n-channel type LDMOS transistor Tr1 is suppressed. Additionally, the region 15 where film thickness at the buried silicon oxide film 2 is thin corresponds to a location where lower potential is distributed in the LDMOS transistor Tr1 , and so high breakdown voltage of the LDMOS transistor Tr1 is assured. Furthermore, the LDMOS transistor Tr1 is surrounded by the silicon oxide films 2 and 5, and so electrical isolation is assured. In this way, heat radiation from the LDMOS transistor Tr1 to the silicon substrate 1 can be improved without impairing the electrical isolation and breakdown voltage of the LDMOS transistor Tr1 . This structure is particularly effective for a power element (high breakdown voltage element) such as an LDMOS transistor having high breakdown voltage.

A method of fabrication will be described next with reference to FIG. 3 through FIG. 7.

Figure 3:
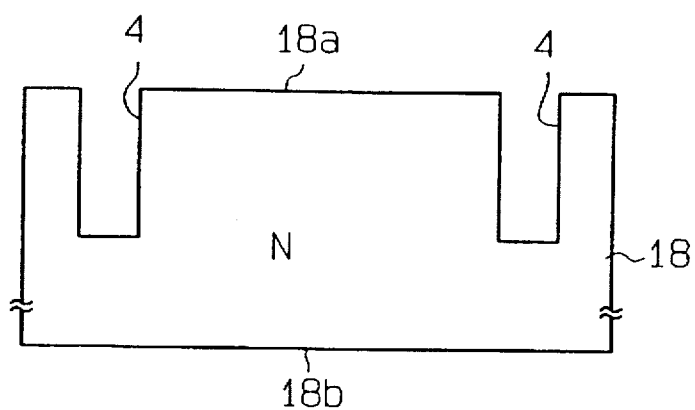
FIG. 3 trough FIG. 7 are sectional views for describing an example of a method of fabricating the semiconductor device according to the first embodiment.

First, as shown in FIG. 3, an n-type silicon substrate 18 of approximately 10 Ω-cm is prepared, and a groove 4 for element isolation is formed in a main surface 18a thereof to a depth of 10 μm.

Figure 4:
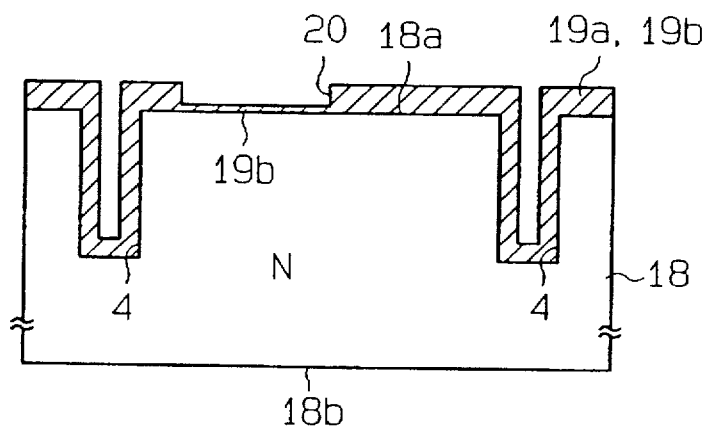

Accordingly, as shown in FIG. 4, a thermal oxide film 19a having a thickness of 2 μm is formed on the main surface 18a of the n-type silicon substrate 18 and the surface of the groove 4. Further, the thermal oxide film 19a is partially removed at the main surface 18a of the substrate by etching, forming an opening 20, and a thin silicon oxide film 19b having a thickness of 0.1 μm is formed on the thermal oxide film 19a including the interior of this opening 20.

Figure 5:
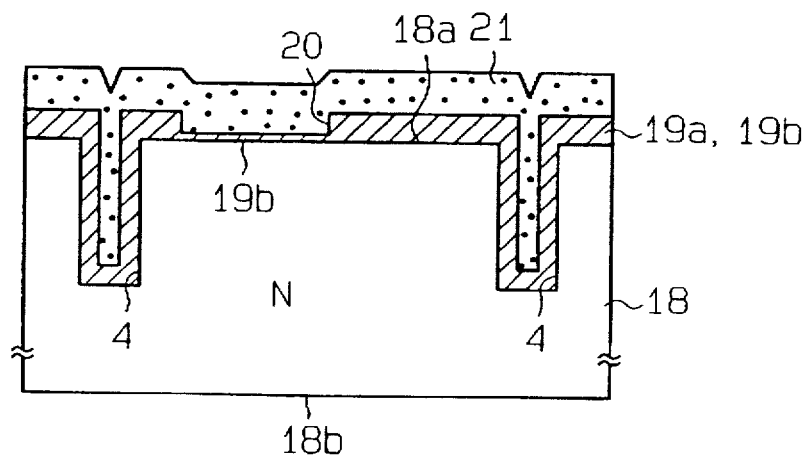
Figure 6:
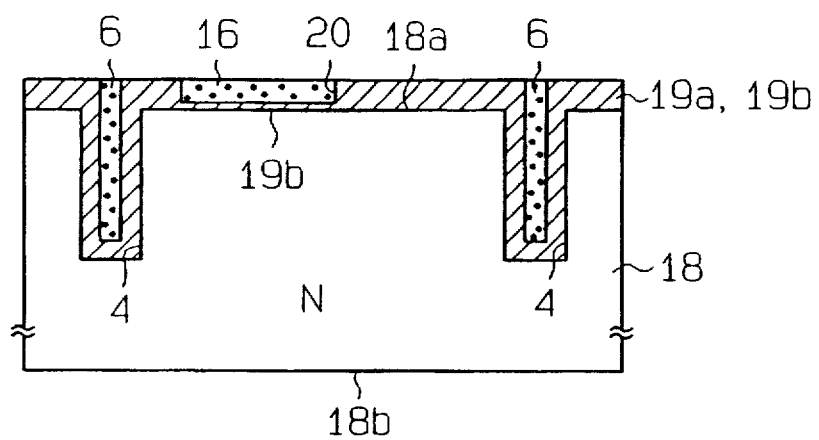

In continuation, as shown in FIG. 5, polycrystalline silicon 21 having a thickness of 10 μm is deposited so that the interior of the groove 4 and the opening 20, the surfaces of which are covered by the oxide films 19a and 19b, are completely buried. Accordingly, the groove 4 and opening 20 on the main surface 18a of the n-type silicon substrate 18 are flattened by grinding and polishing the polycrystalline silicon 21 from the main surface 18a side of the n-type silicon substrate 18 with the oxide films 19a and 19b as stoppers, as shown in FIG. 6.

Figure 7:
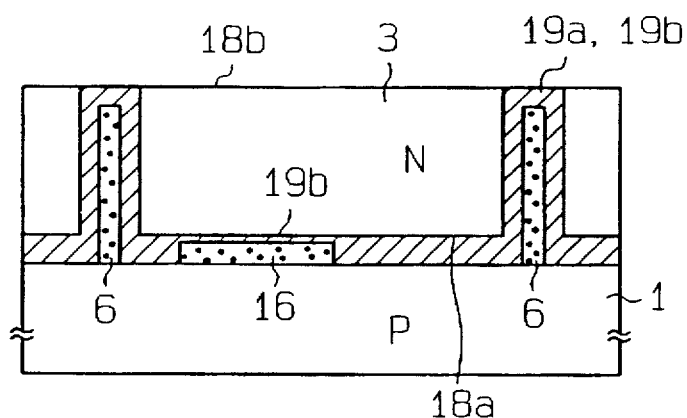

Meanwhile, as shown in FIG. 7, a p-type silicon substrate 1, one surface of which has been polished, is prepared, and the polished surface of this p-type silicon substrate 1 and the main surface 18a side of the above-described flattened n-type silicon substrate 18 are joined and bonded by direct-bonding technology. Accordingly, grinding and polishing are performed from the rear surface (i.e., the surface on the side opposite to the ground and polished surface) 18b side of the n-type silicon substrate 18, and a SOI layer of 10 μm thickness is obtained. Further, hydrofluoric acid is utilized to etch away a predetermined amount of the rear surface 18b of the n-type silicon substrate 18, and the oxide films 19a and 19b appearing on the rear surface 18b are removed by polishing.

Thereafter, as shown in FIG. 1, an n-channel type LDMOS transistor Tr1 is formed within an n-type silicon layer 3 (island silicon region 7).

In this way, the groove 4 for element-isolating use is formed in the main surface 18a of the silicon substrate 18 (first step). The silicon oxide film 19a is formed on the main surface 18a side of the n-type silicon substrate 18 including an inner wall of the groove 4 (second step). The silicon oxide film 19a of a predetermined region on the main surface 18a of the silicon substrate 18 is removed and the opening 20 is formed (third step). The silicon oxide film 19b, having a film thickness required for assuring the minimum breakdown voltage (dielectric strength), is formed on the main surface 18a side of the silicon substrate 18 including the opening 20 (fourth step). The polycrystalline silicon 21 is deposited on the main surface 18a side of the silicon substrate 18 and the opening 20 interior and groove 4 interior are filled with the polycrystalline silicon 21 (fifth step). The main surface 18a side of the silicon substrate 18 is ground and polished and the main surface 18a side of the silicon substrate 18 is flattened (sixth step). The main surface 18a side of the silicon substrate 18 and the polished surface of the other silicon substrate 1 are directly bonded (seventh step). Grinding and polishing are performed from the rear surface 18b side of the silicon substrate 18 and the island silicon region 7 surrounded by the silicon oxide films 19a and 19b is formed (eighth step), and the LDMOS transistor Tr1 (semiconductor element) is formed in the island silicon region 7 (ninth step). Thus a semiconductor device having the structure indicated in FIG. 1 can easily be fabricated. That is to say, fabrication can be accomplished easily by burying polycrystalline silicon 16 in a portion of the buried oxide film 2 which is thin and employing a direct-bonding method while maintaining a degree of flatness thereof.

It is also acceptable to employ a method of fabrication which will be described hereinafter in substitution of the above-described method of fabrication.

Steps from FIG. 3 to FIG. 5 are the same as the steps described above, and flattening is performed from a state wherein the groove 4 and opening 20 have been filled by the polycrystalline silicon 21 as shown in FIG. 5, but it is difficult to completely flatten and level this polycrystalline silicon 21 and the oxide films 19a and 19b.

Figure 8:
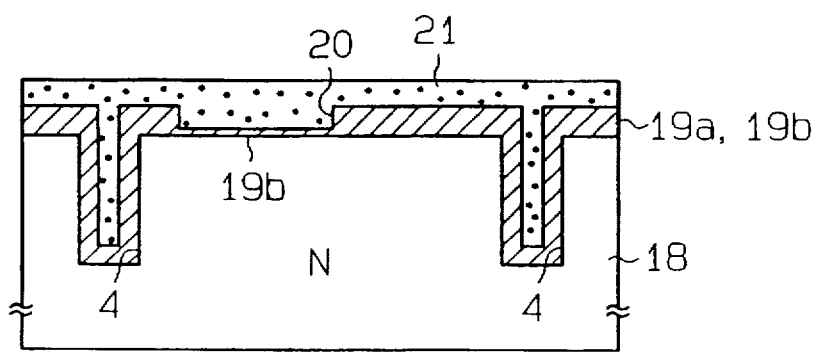
FIG. 8 and FIG. 9 are sectional views for describing another example of a method of fabricating the semiconductor device according to the first embodiment.
Figure 9:
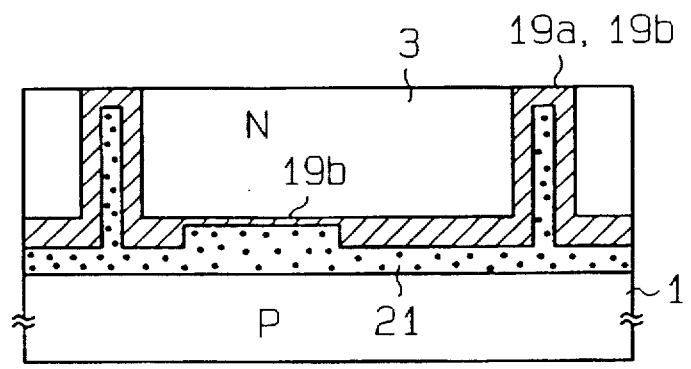

Accordingly, as shown in FIG. 8, flattening is performed so that this polycrystalline silicon 21 remains over the entire surface of the substrate main-surface side, and the polished surface of the separately prepared p-type silicon substrate 1 and the flattened polycrystalline silicon 21 surface are directly bonded as shown in FIG. 9. By doing this, more favorable mutual bonding of mirror surfaces can be achieved.

The description heretofore has concerned an n-channel type LDMOS transistor having high breakdown voltage, but it is also possible to utilize a p-channel type LDMOS transistor having high breakdown voltage, or an integrated structure including an n-channel type LDMOS transistor and p-channel type LDMOS transistor that are individually formed in differing island silicon regions on a single chip.

A second embodiment of the present invention will be described hereinafter primarily in terms of differences with the above-described first embodiment.

Figure 10:
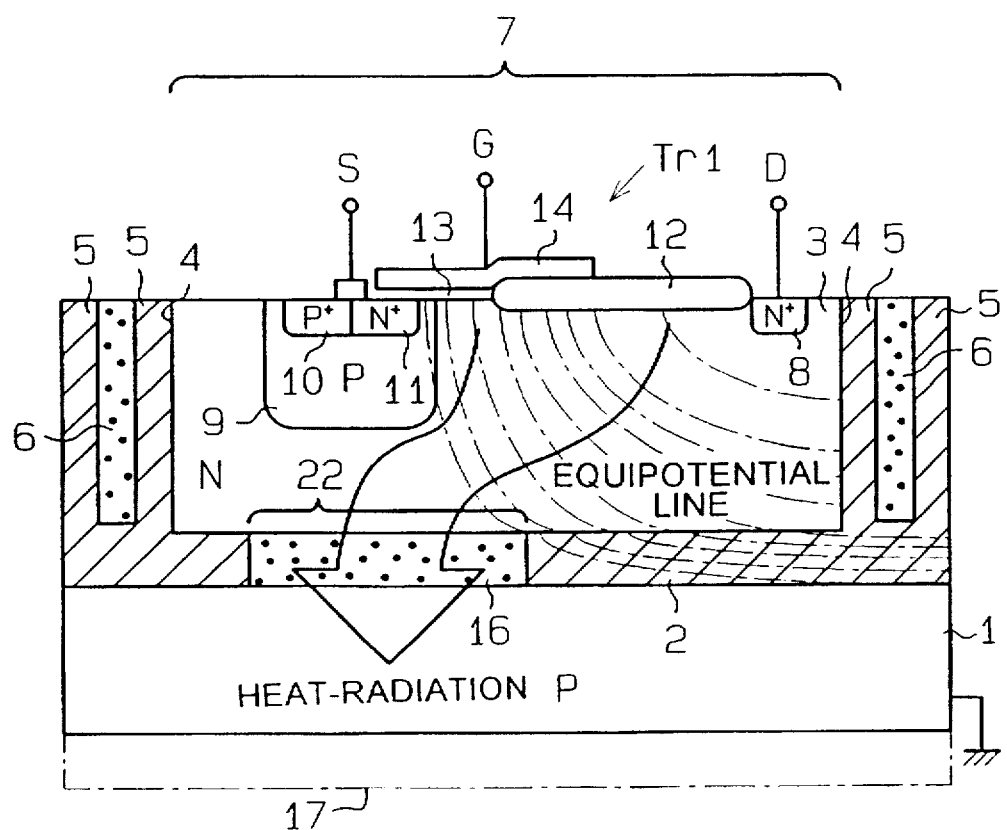
FIG. 10 a sectional view of a semiconductor device according to a second embodiment.

FIG. 10 indicates a structure of an n-channel type LDMOS transistor having high breakdown voltage formed on a SOI substrate.

There is no buried silicon oxide film 2 in a region 22 below the p well region 9, and the polycrystalline silicon 16 is buried and assumes a film thickness identical to the peripheral buried silicon oxide film 2. In this way, film thickness of the buried silicon oxide film 2 of a region in which substantially no voltage is applied (a region for which high breakdown voltage may not be required) such as the region 22 of FIG. 10 is partially caused to be 0 μm.

Additionally, together with introducing impurities into the buried polycrystalline silicon 16 and causing the polycrystalline silicon 16 to be an n-type or p-type layer, the silicon substrate 1 and silicon layer 3 are caused to be of different conductivity type and are isolated by a pn junction. That is to say, the p-type silicon substrate 1 is caused to be ground level and +200 V is applied to the n-type silicon layer 3 via the n$^+$ drain region 8.

Accordingly, heat generated while driving the n-channel type LDMOS transistor Tr1 passes through the region 22 having no buried silicon oxide film 2, is propagated to the silicon substrate 1 side, and is radiated from the heat sink 17, and the temperature increase of the LDMOS transistor Tr1 is suppressed. Additionally, since the region 22 having no buried silicon oxide film 2 corresponds to a location of low potential given in the LDMOS transistor Tr1 , high breakdown voltage required for the LDMOS transistor Tr1 is assured. Further, since the LDMOS transistor Tr1 , or the island silicon region 7, is surrounded by the buried silicon oxide film 2 and the pn-junction portion, electrical isolation is also assured.

In this way, heat radiation from the semiconductor element to the substrate can be improved without impairing electrical isolation and breakdown voltage of the element.

Additionally, according to the present embodiment, the conductivity types of the silicon substrate 1 and silicon layer 3 can be exchanged and a p-channel type LDMOS transistor having high breakdown voltage can be utilized in substitution for the n-channel type LDMOS transistor having high breakdown voltage.

A method of fabrication according to a third embodiment of the present invention will be described next with reference to the drawings.

Figure 11:
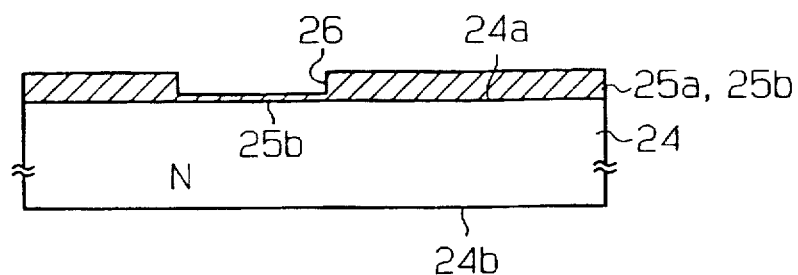
FIG. 11 through FIG. 15 are sectional views for describing an example of a method of fabricating a semiconductor device according to a third embodiment.
Figure 12:
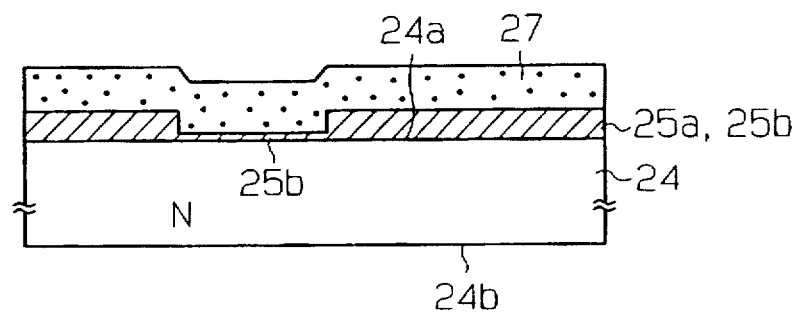

First, as shown in FIG. 11, an n-type silicon substrate 24 of approximately 10 Ω·cm is prepared. Accordingly, a thermal oxide film 25a having a thickness of 2 μm is formed on a main surface 24a of the n-type silicon substrate 24. This thermal oxide film 25a is partially etched away to form an opening 26, and a thin oxide film 25b having a thickness of 0.1 μm is formed over the silicon oxide film 25a including the exposed silicon surface in the opening 26. Further, as shown in FIG. 12, polycrystalline silicon 27 having a thickness of 5 μm is deposited on the oxide films 25a and 25b, filling the opening 26.

Figure 13:
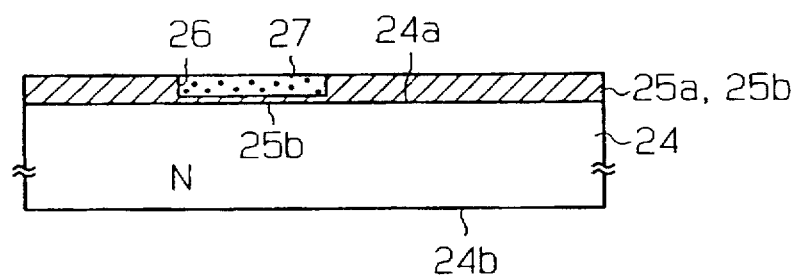

Accordingly, as shown in FIG. 13, the surface of the deposited polycrystalline silicon is ground and polished from the main surface 24a side of the n-type silicon substrate 24, with the oxide films 25a and 25b as stoppers. As a result of this, the deposited polycrystalline silicon in the opening 26 is leveled with the peripheral oxide films 25a and 25b on the main surface 24a side of the n-type silicon substrate 24.

Figure 14:
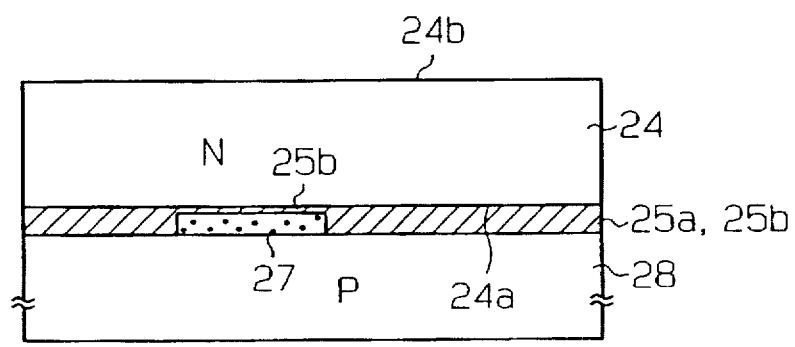
Figure 15:
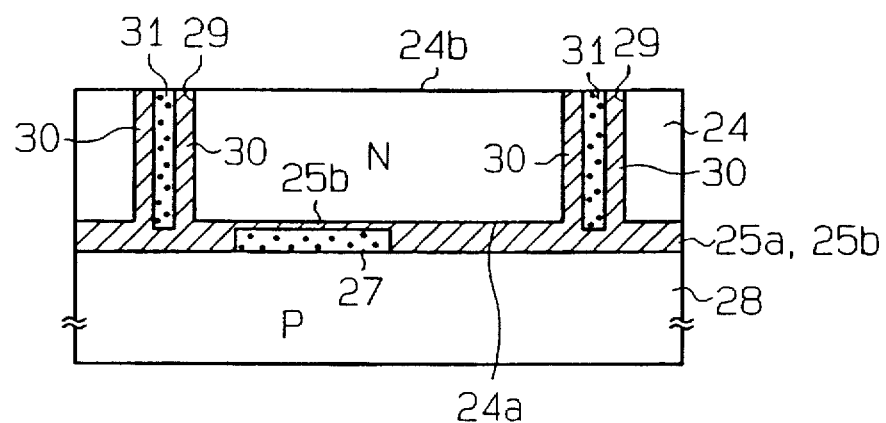
Figure 16:
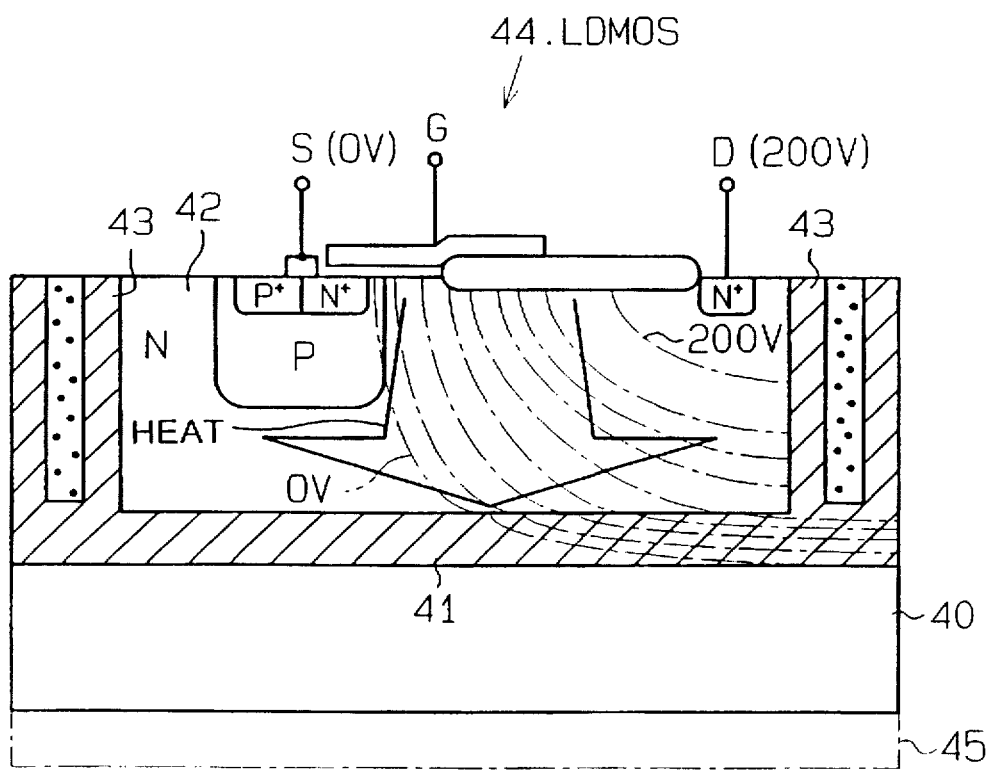
FIG. 16 is sectional view of a conventional semiconductor device.

In continuation, as shown in FIG. 14, a p-type silicon substrate 28, one surface of which has been polished, is prepared, and the polished surface of the p-type silicon substrate 28 and the main surface 24a side of the above-described polished n-type silicon substrate 24 are joined by direct-bonding technology. Further, as shown in FIG. 15, grinding and polishing are performed from a rear surface 24b (i.e., the surface on the side opposite to the ground and polished surface 24a) of the n-type silicon substrate 24, and a SOI layer of 10 μm thickness is obtained. Accordingly, a groove 29 for element isolation is formed in the n-type silicon substrate 24, or the SOI layer. Further, an oxide film 30 is formed on an inner wall of the groove 29 by thermal oxidation, and then, polycrystalline silicon 31 is deposited on the n-type silicon substrate 24 to fill the groove 29. Flattening by grinding and polishing is again performed to remove the excessively deposited polycrystalline silicon over the silicon substrate 24, thereby obtaining a SOI substrate having a plurality of an island silicon regions. Thereafter, a semiconductor element (the n-channel type LDMOS transistor having high breakdown voltage Tr1 indicated in FIG. 1) is formed.

In this way, the silicon oxide film 25a is formed on the main surface 24a of the silicon substrate 24 (first step). The silicon oxide film 25a of a predetermined region is removed and the opening 26 is formed (second step). The silicon oxide film 25b having a film thickness required for assuring breakdown voltage is formed on the main surface 24a side of the silicon substrate 24 including the opening 26 (third step). The polycrystalline silicon 27 is deposited from the main surface 24a side of the silicon substrate 24 and the opening 26 interior is filled with the polycrystalline silicon 27 (fourth step). The main surface 24a side of the silicon substrate 24 is ground and polished to flatten the main surface 24a side of the silicon substrate 24 (fifth step). The main surface 24a side of the silicon substrate 24 and the polished surface of the p-type silicon substrate 28 are directly bonded (sixth step). Grinding and polishing are performed from the rear surface 24b of the silicon substrate 24 (seventh step). The groove 29, for element-isolating use, is formed in the silicon substrate 24, reaching through to the silicon oxide film 25a (eighth step). The silicon oxide film 30 is formed on an inner wall of the groove 29 (ninth step). The polycrystalline silicon 31 is deposited on the silicon substrate 24 and the groove 29 interior is filled with the polycrystalline silicon 31, and successively, the surface side of the silicon substrate 24 is ground and polished and the surface side of the silicon substrate 24 is flattened (tenth step). Then the semiconductor element is formed in the island silicon region surrounded by the silicon oxide films 25a, 25b, and 30 (eleventh step).

As a result of this, a semiconductor device having the structure indicated in FIG. 1 can easily be fabricated. That is to say, fabrication can be accomplished easily by burying polycrystalline silicon (27 in FIG. 14) in a portion of the buried oxide films (25a and 25b in FIG. 14) which is thin and employing a direct-bonding method while maintaining a degree of flatness thereof.

According to the above-described various embodiments, film, thickness of a buried oxide film in a region where an equipotential line of substantially 0 V is distributed, is controlled, but even in a region where breakdown voltage of a certain extent is demanded, for example a region wherein field strength within the buried oxide film becomes one-half or less of that of a region requiring maximum breakdown voltage, it is sufficient to assure film thickness in the buried oxide film such that dielectric strength corresponding to the demanded breakdown voltage is obtained. In this case, thermal conductivity and film thickness (i.e., dielectric strength or withstanding voltage) are in a trade-off relationship, and so a need exists to assure favorable thermal conductivity as well.

The description heretofore has been concerned with an LDMOS transistor as the semiconductor element, but it is also acceptable for the semiconductor element formed in the island silicon region to be a transistor of other than LDMOS type, an insulated gate bipolar transistor IGBT, a thyristor, a diode, a resistor, or the like.

Additionally, it is also acceptable to employ a silicon nitride film or the like in substitution of silicon oxide film as the insulation film.

Furthermore, it is acceptable to employ an amorphous silicon, a metal having a high melting point such as tungsten, or the like instead of polycrystalline silicon as material disposed in the region wherein the insulation film is thin or has been eliminated. That is to say, a material of thermal conductivity superior to the insulation, film (silicon oxide film or the like) and which does not deform even at high temperature can be utilized.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor device comprising:

a semiconductor substrate;

an insulation film disposed on said semiconductor substrate; and a semiconductor layer disposed on said semiconductor substrate with said insulation film interposed therebetween; and a semiconductor element formed in said semiconductor layer, said semiconductor element including a high potential region applied with a relatively higher voltage and a low potential region applied with a relatively lower voltage when said semiconductor element is brought into an operative state, wherein said insulation film has a thin portion where a thickness thereof is locally made thin, and said thin portion of said insulation film is located only on a low potential region side rather than at a point at which an equipotential line extending from said low potential region intersects said insulation film.

2. A semiconductor device according to claim 1, wherein said relatively lower voltage is substantially 0.

3. A semiconductor device according to claim 1, wherein said semiconductor element is an n-channel type lateral double-diffused MOS transistor and said portion of said thin insulation film is located beneath a source region thereof.

4. A semiconductor device according to claim 1, further comprising a buried polycrystalline silicon disposed in correspondence with said thin portion of said insulation film for said thin portion to provide a surface coplanar with a surrounding insulation film.

5. A semiconductor device according to claim 1, further comprising a buried polycrystalline silicon disposed in correspondence with said thin portion of said insulation film between said insulation film and said semiconductor substrate to provide a uniform spacing between said semiconductor substrate and said semiconductor element.

6. A semiconductor device comprising:
   a semiconductor substrate;
   an insulation film disposed on said semiconductor substrate;
   a semiconductor layer disposed on said semiconductor substrate with said insulation film interposed therebetween; and
   a semiconductor element formed in said semiconductor layer, said semiconductor element including a high potential region applied with a relatively higher voltage and a low potential region applied with a relatively lower voltage when said semiconductor element is brought into an operative state,
   wherein said insulation film has a portion where said insulation film is locally absent, and said portion of said insulation film is located only on a low potential region side rather than at a point at which an equipotential line extending from said low potential region intersects said insulation film, and
   wherein a pn-junction isolation is provided between said semiconductor substrate and said semiconductor layer at said portion of said insulation film.

7. A semiconductor device according to claim 6, wherein said relatively lower voltage is substantially 0.

8. A semiconductor device according to claim 6, wherein said semiconductor element is an n-channel type lateral double-diffused MOS transistor and said portion of said insulation film is located beneath a source region thereof.

9. A semiconductor device according to claim 6, further comprising a buried conductive polycrystalline silicon disposed in correspondence with said portion of said insulation film for said portion of said insulation film to provide a surface coplanar with a surrounding insulation film.

10. A semiconductor device comprising:
    a semiconductor substrate;
    an insulation film disposed on said semiconductor substrate;
    an island silicon region disposed on said semiconductor substrate with said insulation film interposed therebetween;
    a semiconductor element formed within said island silicon region, said semiconductor element forming in said island silicon region a first region in which a potential difference with said semiconductor substrate becomes a first potential difference and a second region in which a potential difference with said semiconductor substrate becomes a second potential difference smaller than said first potential difference; and
    a heat-transmission region composed of material having a higher thermal conductivity than said insulation film, said heat-transmission region being disposed within said insulation film only on a second region side rather than at a point at which an equipotential line extending from said second region intersects said insulation film.

11. A semiconductor device according to claim 10, wherein said heat-transmission region is buried within a portion of said insulation film.

12. A semiconductor device according to claim 10, wherein said first region is a region in which a potential difference with said semiconductor substrate becomes largest in said island silicon region, and said second region is a region having a potential difference of atmost half of said first potential difference.

13. A semiconductor device comprising:
    a semiconductor substrate fixed at a predetermined potential;
    an insulation film disposed on said semiconductor substrate;
    a silicon region disposed on said semiconductor substrate with said insulation film interposed therebetween;
    a semiconductor element formed within said silicon region, said semiconductor element having a first region in which a potential difference with said predetermined potential of said semiconductor substrate becomes largest and a second region in which a potential difference with said predetermined potential of said semiconductor substrate becomes smallest when said semiconductor element is brought into an operative state; and
    a heat-transmission region composed of material having a higher thermal conductivity than said insulation film and formed within said insulation film only on a second region side rather than at a point at which an equipotential line extending from said second region intersects said insulation film.

14. A semiconductor device according to claim 13, wherein said heat-transmission region is buried within a portion of said insulation film.

15. A semiconductor device according to claim 13, wherein said potential difference in said second region is atmost half of said potential difference in said first region.

16. A semiconductor device comprising:
    a semiconductor substrate;
    an insulation film disposed on said semiconductor substrate;
    an island silicon region disposed on said semiconductor substrate with said insulation film interposed therebetween; and
    a semiconductor element formed within said island silicon region, said semiconductor element forming in said island silicon region a high potential region applied with a relatively higher voltage and a low potential region applied with a relatively lower voltage when said semiconductor element is brought into an operative state; and
    a heat-transmission region composed of material having a higher thermal conductivity than said insulation film, said heat-transmission region being disposed to be buried in a region within said insulation film only on a low potential region rather than at a point at which an equipotential line corresponding to at most half of a potential of said high potential region intersects said insulation film.

17. A semiconductor device according to claim 10, wherein said heat-transmission region is composed of one of polycrystalline silicon and amorphous silicon.

18. A semiconductor device according to claim 10, wherein said heat-transmission region makes up a pn-junction between said semiconductor substrate and said island silicon region.

19. A semiconductor device according to claim 10, wherein said heat-transmission region is buried within said insulation film such that an interval between said semiconductor substrate and said island silicon region is made to be uniform.

* * * * *